(12) United States Patent
Shastri et al.

(10) Patent No.: US 7,466,212 B2
(45) Date of Patent: Dec. 16, 2008

(54) SEMICONDUCTOR FILTER STRUCTURE AND METHOD OF MANUFACTURE

(75) Inventors: Sudhama Shastri, Phoenix, AZ (US); Ryan Hurley, Gilbert, AZ (US); Yenting Wen, Chandler, AZ (US); Emily M. Linehan, Gilbert, AZ (US); Mark A. Thomas, Negri Sembilan (MY); Earl D. Fuchs, Phoenix, AZ (US)

(73) Assignee: Semiconductor Components Industries, L. L. C., Phoenix, AZ (US)

( * ) Notice: Subject to any disclaimer, the term of this patent is extended or adjusted under 35 U.S.C. 154(b) by 306 days.

(21) Appl. No.: 11/454,387

(22) Filed: Jun. 16, 2006

(65) Prior Publication Data

US 2007/0290298 A1    Dec. 20, 2007

(51) Int. Cl.
   *H03H 9/00* (2006.01)
(52) U.S. Cl. .................................. 333/186; 257/532
(58) Field of Classification Search .............. 333/186; 257/277, 531, 532, 533
   See application file for complete search history.

(56) References Cited

U.S. PATENT DOCUMENTS

| | | | |
|---|---|---|---|
| 3,671,793 A | 6/1972 | Scarlett | |
| 4,211,941 A * | 7/1980 | Schade, Jr. | 327/565 |
| 4,633,291 A | 12/1986 | Koyama | |
| 6,362,012 B1 | 3/2002 | Chi | |
| 6,861,926 B1 | 3/2005 | Wang et al. | |
| 6,953,980 B2 | 10/2005 | Escoffier et al. | |

OTHER PUBLICATIONS

Article "EMI Filters in Wireless Applications", by Fabien Franc published in Electronic Products Supplement, Spring 2002, pp. 1-2, http://electronicproducts.com.
Data Sheet, "LCD & Camera EMI Filter Array with ESD Protection", Preliminary CM1450, California Micro Devices, 2005 pp. 1-8, www.calmicro.com.
Data Sheet, "LCD & Camera EMI Filter Array with ESD Protection", Preliminary CM1451, California Micro Devices, 2005 pp. 1-8, www.calmicro.com.
Data Sheet, "5$^{th}$-Order, Lowpass, Elliptic, Switched-Capacitor Filters" MAX7408/MAX7411/MAX7412/MAX7415, Maxim Integrated Products, 19-1378, Rev 1: Oct. 1998, pp. 1-12, http://www.maxin-ic.com.
Data Sheet, STF202-22 "USB Filter with ESD Protection", Publication Order No. STF202-22T1/D, Jul. 2002-Rev. 6, pp. 1-8, www.onsemi.com.
Data Sheet, NUF6106FCT1 "6 Channel EMI Pi-Filter Array with ESD Protection", Publication Order No. NUF6106FC/D, Mar. 2004-Rev.0, pp. 1-4, www.onsemi.com.

(Continued)

*Primary Examiner*—Daniel D Chang
(74) *Attorney, Agent, or Firm*—Kevin B. Jackson

(57) ABSTRACT

In one embodiment, a split well region of one conductivity type is formed in semiconductor substrate of an opposite conductivity type. The split well region forms one plate of a floating capacitor and an electrode of a transient voltage suppression device.

27 Claims, 9 Drawing Sheets

OTHER PUBLICATIONS

Data Sheet, NUF2101M "USB Filter with ESD Protection", Publication Order No. NUF2101M/D, Aug. 2005-Rev.1, pp. 1-4, www.onsemi.com.

"Integrated Multilayer RF Passives in Silicon Technology", by Joachim N. Burghartz, pp. 141-147, published by IEEE, 1998, 0-7803-5288-2/98/$10.00.

"Future Package Technologies for Wireless Communication Systems" by Telesphor Kamgaing, et al., Intel Corporation 2005, pp. 353-364, http://developer.intel.com.

USPTO Office Action for Case U.S. Appl. No. 11/454,682, by Sudhama Shastri et al; Mailed Apr. 16, 2008.

* cited by examiner

US 7,466,212 B2

SEMICONDUCTOR FILTER STRUCTURE AND METHOD OF MANUFACTURE

FIELD OF THE INVENTION

This invention relates generally to electronic devices, and more specifically to semiconductor device structures and methods of their manufacture.

BACKGROUND OF THE INVENTION

Electronic filters are used today to suppress noise, reject unwanted signals, or in some way manipulate the characteristics of an input signal. Typical semiconductor based filter designs comprise inductor, resistor and/or capacitor networks. Such networks are often placed together with separate transient voltage suppression (TVS) devices such as Zener diodes to provide ESD protection in addition to signal processing. The capacitance contribution of the TVS device often is used to further shape the filter characteristic.

An elliptic or Cauer filter is one type of filter design that utilizes inductors and capacitors. Elliptic filters are desirable in certain applications such as electromagnetic interference (EMI) or Universal Serial Bus (USB) filter applications, because they have equal ripple in both the pass band and stop band, a sharp cut-off characteristic, a low group delay for given stop-band characteristics, and excellent stop band attenuation compared to other classic filter designs such as Chebyshev filters.

One challenge semiconductor based filter designers face is providing an effective design in as small a space as possible in order to meet the size requirements that some applications demand. This challenge is often difficult, particularly when the filter design includes inductor and capacitor structures together with TVS devices.

Accordingly, a structure and method of manufacture are needed that improve the integration of passive components with TVS devices in order to meet the challenges described above as well as others.

For simplicity and clarity of illustration, elements in the figures are not necessarily to scale, and the same reference numbers in different figures denote the same elements. Additionally, descriptions and details of well-known steps and elements are omitted for simplicity of the description. As used herein, current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-channel devices, a person of ordinary skill in the art will appreciate that complementary devices are also possible in accordance with the present invention. For clarity of the drawings, doped regions of device structures are illustrated as having generally straight line edges and precise angular corners. However, those skilled in the art understand that due to the diffusion and activation of dopants the edges of doped regions are generally not straight lines and the corners are not precise angles.

DETAILED DESCRIPTION OF THE DRAWINGS

Figure 1:
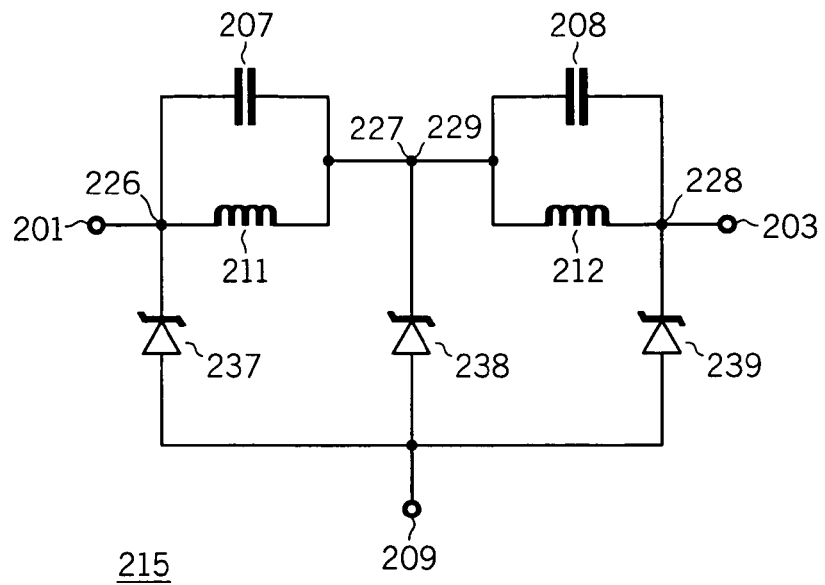
FIG. 1 illustrates a schematic of a prior art elliptic filter circuit.

FIG. 1 schematically illustrates a prior art embodiment of a circuit that represents an elliptic filter structure 215 having an input 201 and an output 203. Filter 215 includes an inductor 211 coupled in parallel with a linear capacitor 207 to form a first resonant circuit. An inductor 212 is coupled in parallel with a linear capacitor 208 to form a second resonant circuit. A first separate TVS device 237 is connected between a first terminal 226 of inductor 211 and a common return terminal 209. A second separate TVS device 238 is connected between terminal 209 and a common connection to a second terminal 227 of inductor 211 and a first terminal 229 of inductor 212. A third separate TVS device 239 is connected between a second terminal 228 of inductor 12 and terminal 209.

Figure 2:
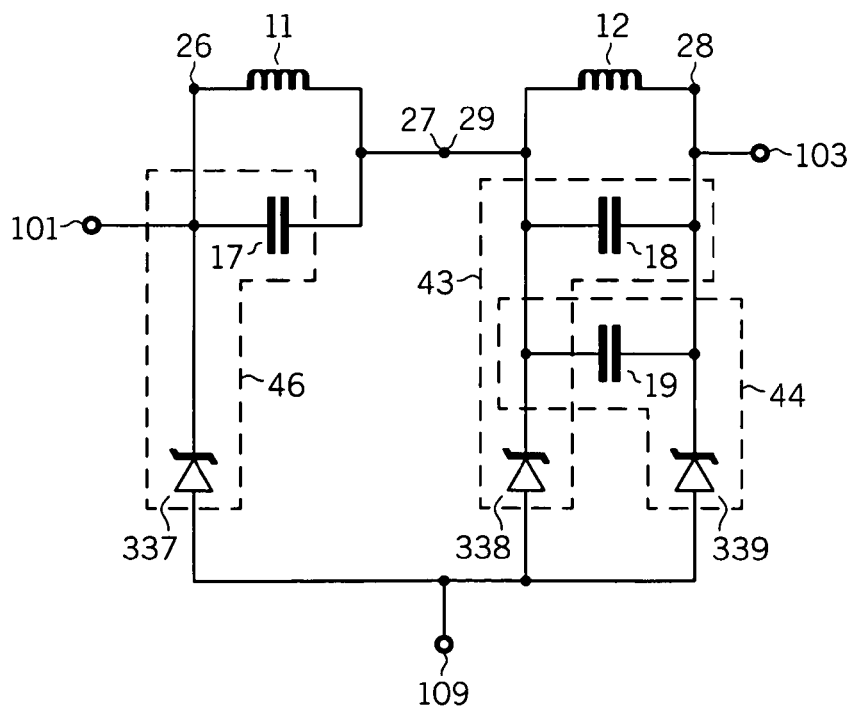
FIG. 2 illustrates a schematic of a filter circuit in accordance with an embodiment of the present invention.

FIG. 2 schematically illustrates an embodiment of a circuit that represents an elliptic filter structure 15 in accordance with an embodiment of the present invention with an input 101 and an output 103. Structure 15 includes an inductor 11 coupled in parallel with a floating capacitor 17 to form a first resonant circuit. Inductor 11 includes an input terminal 26 and output terminal 27. Structure 15 further includes an inductor 12 in parallel with floating capacitors 18 and 19. Inductor 12 includes an input terminal 29, which is a common connection with output terminal 27, and an output terminal 28. A first TVS device 337 is connected between input terminal 26 and a common return terminal 109. A second TVS device 338 is connected between input terminal 29 and common return terminal 109, and third TVS device 339 is connected between output terminal 28 and common return terminal 109.

In accordance with the present invention, floating capacitor 17 comprises, for example, a first MOS capacitor, and is combined or integrated with TVS device 337 into a single device or device 46. Floating capacitor 18 comprises, for example, a second MOS capacitor, and is combined or integrated with TVS device 338 into a single device or device 43. Floating capacitor 19 comprises, for example, a third MOS capacitor, and is combined or integrated with TVS device 339 into a single device or device 44. The capacitances of these devices are adjusted according to the output requirements or specifications of filter or structure 15.

Figure 3:
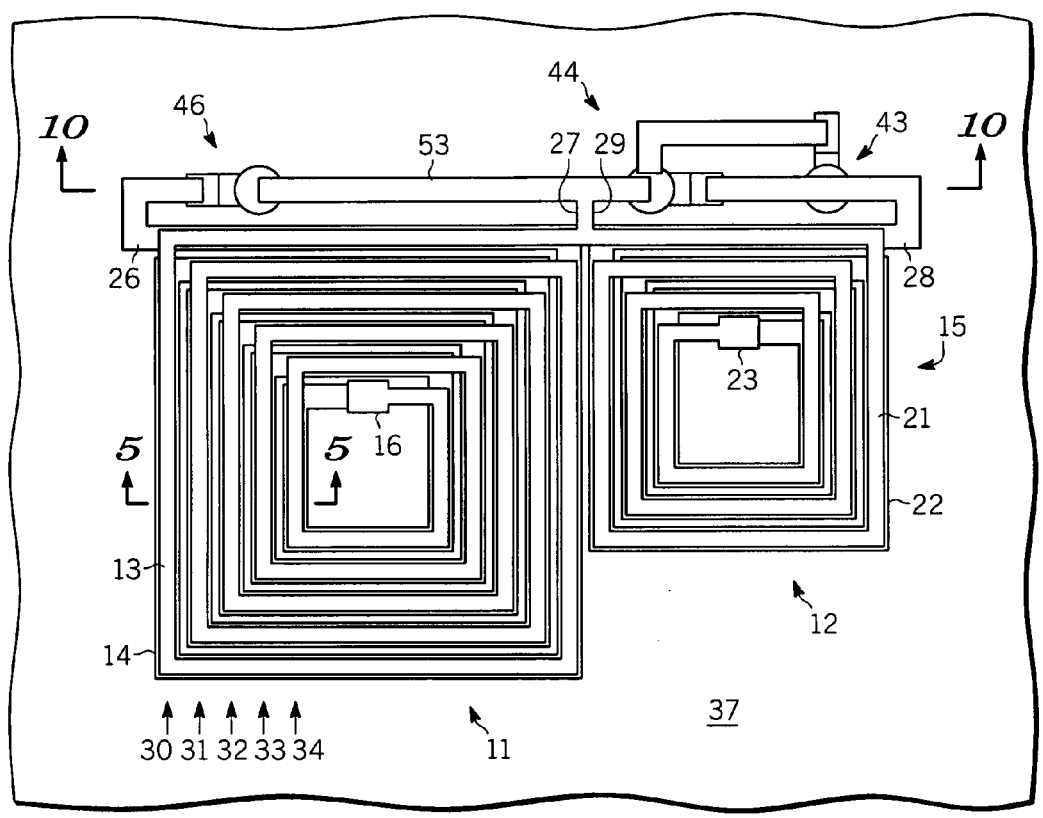
FIG. 3 illustrates an enlarged plan view of a portion of a structure including an implementation of the filter circuit of FIG. 2 in accordance with the present invention.
Figure 4:
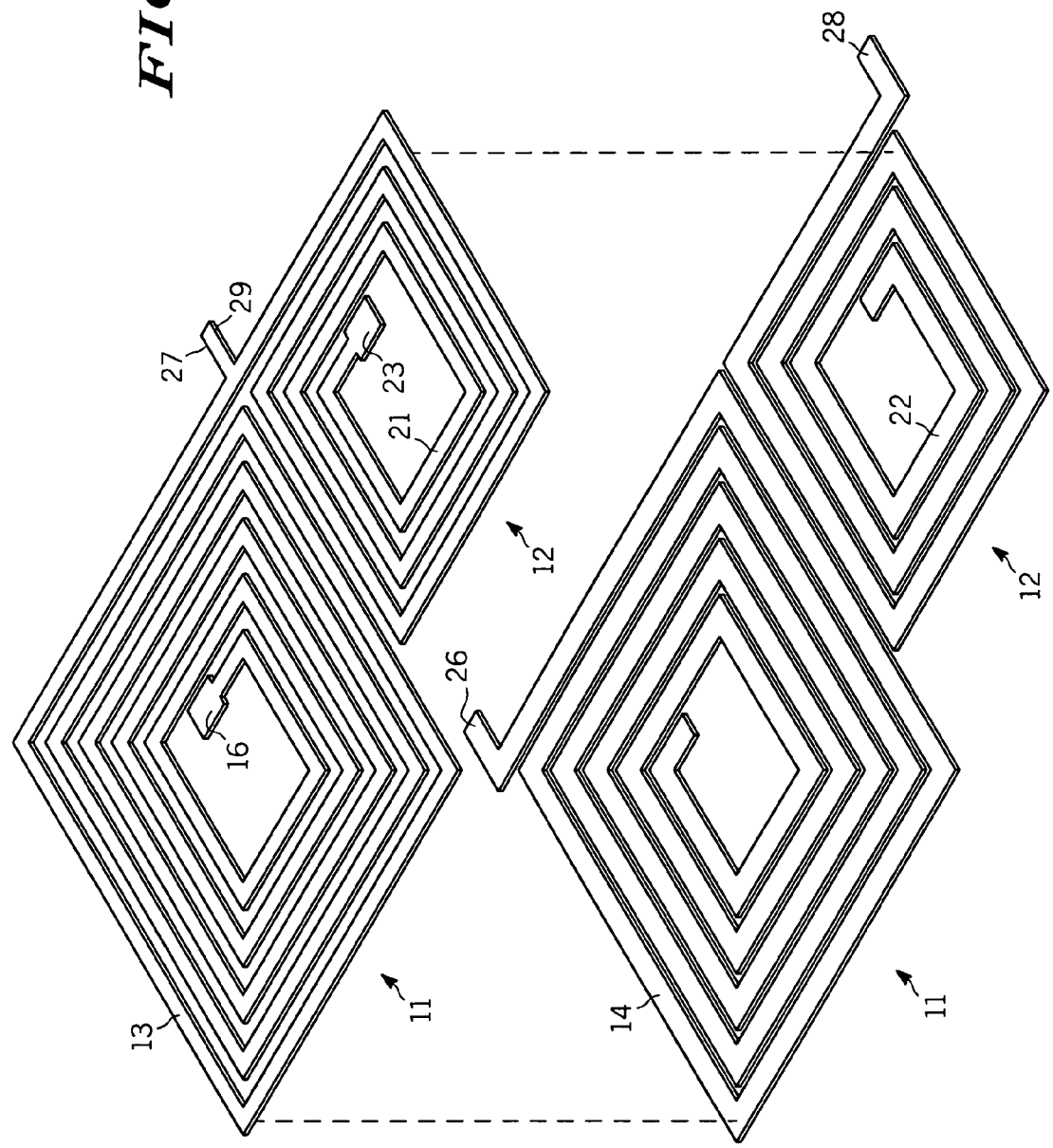
FIG. 4 illustrates an enlarged exploded view of a portion of the device of FIG. 3.
Figure 5:
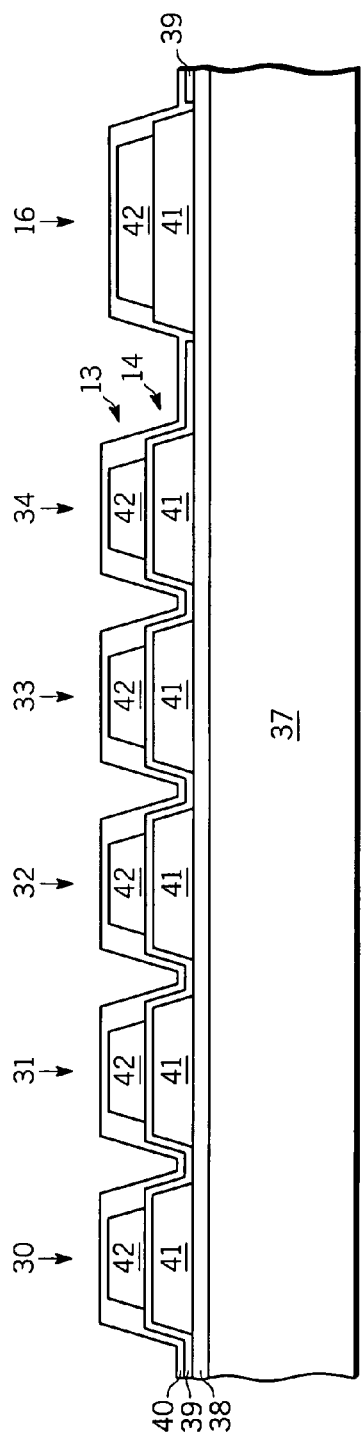
FIG. 5 illustrates an enlarged cross-sectional view of a portion of the device of FIG. 3 taken along reference line 5-5.

The following description has reference to FIG. 3, FIG. 4 and FIG. 5. FIG. 3 illustrates an enlarged plan view of a portion of an embodiment of a semiconductor device 10 that includes structure 15 of FIG. 2 in accordance with the present invention. Structure 15 is identified in a general manner by an arrow. Devices 43, 44, and 46 are shown connected to inductors 11 and 12. In this embodiment, inductors 11 and 12 comprise stacked or multi-layer structures. As will be understood by those skilled in the art, integrated semiconductor inductors such as inductor 11 or inductor 12 or the combination thereof may be used to form several types of filters including Bessel, band pass, Chebyschev, and/or elliptic filters. It is further understood that inductors 11 and 12 may comprise single layer inductors. FIG. 4 illustrates an enlarged exploded view of a portion of inductor structures 11 and 12 of FIG. 3. FIG. 5 illustrates, in a general way, an enlarged cross-sectional view of a portion of first stacked inductor 11 taken along reference line 5-5 of FIG. 3. The cross-section of FIG. 5 is illustrated to cut through legs 30, 31, 32, 33, and 34 of inductor 11 shown in FIG. 3.

Inductor 11 is formed to include a first inductor element 14 and a second inductor element 13. First inductor element 14 is formed to overlie a first portion of a surface of substrate 37 and second inductor element 13 is formed overlying element 14. Element 14 is formed in a pattern that provides electro-magnetic coupling between adjacent portions of element 14 in order to provide element 14 an inductance that is greater than the inductance of a straight line conductor. Element 13 is formed in a similar pattern overlying element 14 such that the pattern of element 13 provides electro-magnetic coupling between adjacent portions of element 13 in order to provide element 13 an inductance that is greater than the inductance of a straight line conductor. Further, elements 13 and 14 are magnetically coupled to each other.

Additionally, the pattern and the overlying proximity of elements 14 and 13 provide electro-magnetic coupling between elements 13 and 14 such that elements 13 and 14 form an inductance for inductor 11 that is greater than the sum of the separate inductance of element 13 plus the separate inductance of element 14. Typically, adjacent portions of element 14 are about one to six (1-6) microns apart and adjacent portions of element 13 are about one to ten (1-10) microns apart. Element 13 typically is about one-half to two (0.5-2) microns from element 14 in order to ensure that there is sufficient coupling therebetween. One end or terminal of element 13 is electrically connected to one end or terminal of element 14 at a node 16 in order to provide an electrical connection between elements 13 and 14. A second terminal of element 14 functions as terminal 26 of inductor 11 and a second terminal of element 13 functions as terminal 27 of inductor 11.

Inductor 12 is formed to include a first inductor element 22 and a second inductor element 21. First inductor element 22 is formed to overlie a second portion of the surface of substrate 37 and second inductor element 21 is formed overlying element 22. Element 22 is formed in a pattern that provides electro-magnetic coupling between adjacent portions of element 22 in order to provide element 22 an inductance that is greater than the inductance of a straight line conductor. Element 21 is formed in a similar pattern overlying element 22 such that the pattern of element 21 provides electro-magnetic coupling between adjacent portions of element 21 in order to provide element 21 an inductance that is greater than the inductance of a straight line conductor. Additionally the pattern and the overlying proximity of elements 22 and 21 provide electro-magnetic coupling between elements 22 and 21 such that elements 22 and 21 form an inductance for inductor 12 that is greater than the sum of the separate inductance of element 21 plus the separate inductance of element 22. One end or terminal of element 21 is electrically connected to one end or terminal of element 22 at a node 23 in order to provide an electrical connection between elements 22 and 21. A second terminal of element 22 functions as terminal 28 of inductor 12 and a second terminal of element 21 functions as terminal 29 of inductor 12.

In one embodiment, elements 13 and 14 are formed in the shape of a square spiral. However, each of elements 13 and 14 may be formed in other shapes that provide mutual magnetic flux coupling between adjacent portions of element 13 and that provide mutual flux coupling between adjacent portions of element 14, and between elements 13 and 14. For example, elements 13 and 14 may be formed in a circular spiral, or an elongated spiral, or any well known shapes that provide magnetic flux coupling. In this preferred embodiment, element 14 begins at node 26 and extends in a clockwise direction above the surface of substrate 37 until terminating in terminal 16. Element 13 begins at node 16 and extends in a clockwise direction overlying portions of element 14 that have substantially the same radius as the corresponding portion of element 13 until terminating at terminal 27. Inductor 12 is formed similarly to inductor 11. Element 22 begins at node 23 and extends in a clockwise direction above the surface of substrate 37 until terminating at terminal 28. Element 21 begins at node 29 and extends in a clockwise direction overlying similar portions of element 22 until terminating at terminal 23. The exploded view in FIG. 4 assists in illustrating the overlying relationships between elements 13 and 14 and elements 21 and 22.

Referring to FIG. 3 and FIG. 5, element 14 typically includes a conductor 41 and an overlying dielectric 39. Element 13 typically includes a conductor 42 and an overlying dielectric 40. Typically, conductors 41 and 42 are formed from low resistance conductor materials such as metals in order to minimize the series resistance. The material used for conductors 41 and 42 typically has a resistivity that is no greater than about four to five (4-5) micro ohm-cm. Elements 13 and 14 typically are formed overlying the first portion of substrate 37. A dielectric 38 typically is formed on a surface of substrate 37 in order to electrically insulate inductor 11 from substrate 37. Conductor 41 is formed on the surface of dielectric 38 in the desired pattern of element 14. For example, a mask may be applied to dielectric 38 and patterned to expose the portions of dielectric 38 where conductor 41 is to be formed. Alternatively, a layer of conductive material is deposited overlying dielectric layer 38, and subsequently patterned using conventional photolithographic and etc techniques to form conductor 41. Thereafter, dielectric 39 is formed overlying conductor 41. Dielectric 39 may not be formed on the portion of conductor 41 where node 16 is formed. Conductor 42 is formed on the surface of dielectric 39 that is overlying the top surface of conductor 41. Conductor 42 is also formed on the surface of conductor 41 where node 16 is formed. A dielectric 40 optionally is applied to cover conductor 42 to electrically insulate conductor 42 from other elements of device 10.

Inductor 12 is formed in a manner similar to inductor 11. Element 22 includes a conductor similar to conductor 41 and an overlying dielectric similar to dielectric 39. Element 21 includes a conductor similar to conductor 42 and overlying dielectric similar to dielectric 40. Node 23 is formed in a manner similar to node 16.

Figure 6:
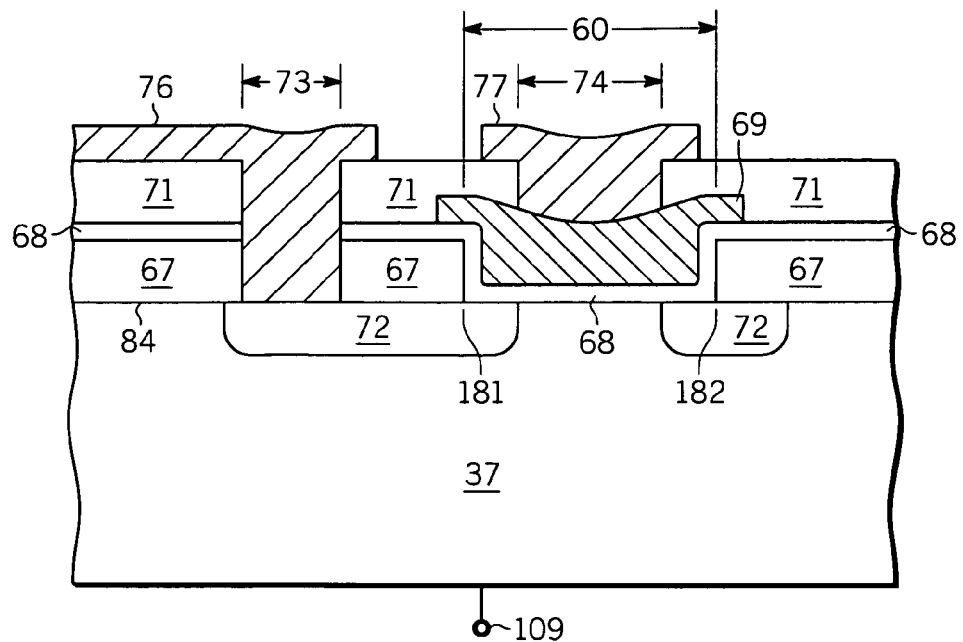
FIG. 6 illustrates an enlarged partial cross-sectional view of an embodiment of a device in accordance with the present invention.

FIG. 6 shows a highly enlarged partial cross-sectional view of an integrated linear (i.e., voltage independent) floating capacitor or MOS capacitor structure or capacitor/TVS structure or device 81 suitable for use as device 43, 44, and/or 46 in structure 15 in accordance with a first embodiment of the present invention. Device 81 is referred to as integrated because it is a single device that functions both as a capacitive element (i.e., a MOS gated diode) and as a transient voltage element. Device 81 is referred to as floating because both contacts of the capacitor (e.g., contacts 69 and 76 described below) are isolated from ground or common return terminal 109. This supports certain filter or circuit designs such as elliptic filters.

Device 81 comprises semiconductor substrate or region 37, which is, for example a <100> p-type conductivity substrate having a dopant concentration on the order of about $1.0 \times 10^{19}$ atoms/cm$^3$. In one embodiment, substrate 37 comprises silicon. Alternatively, substrate 37 comprises other semiconductor materials such IV-IV or III-V materials. Additionally, it is understood that the term semiconductor substrate means a region of semiconductor material, and this can include a semiconductor wafer, a region of semiconductor material formed within a semiconductor wafer, a layer of semiconductor material formed overlying a semiconductor wafer, or a layer of semiconductor material formed overlying an insulative layer or insulative material.

A well, split well, doped, or diffused region 72 is formed in region 37 and extends from a major surface 84. In this embodiment, well region 72 has n-type conductivity and a dopant concentration on the order of about $1.0 \times 10^{20}$ atoms/cm$^3$. By way of example, ion implantation and photomasking techniques are used to form split well region 72. Alternatively, a hardmask process is used to form split well region 72. An isolation or passivation layer 67 is formed overlying major surface 84 and well region 72, and comprises silicon dioxide, a deposited oxide, a nitride, a spin-on glass, combinations thereof, or the like. Opening 60 is then formed in a portion of layer 67 above the split portion of well region 72, and a passivating or capacitive layer 68 is formed in opening 60 and overlying layer 67. Capacitive layer 68 comprises for example, an oxide and has a thickness selected according to desired capacitive/voltage characteristics of device 61. By way of example, layer 68 has a thickness from about 0.005 microns to about 0.05 microns when layer 68 comprises a silicon oxide. It is understood that layer 68 may comprise other materials such as silicon nitride, tantalum pentoxide, barium strontium titanate, titanium dioxide or combinations thereof including combinations with silicon oxide or the like.

A first contact or conductive layer 69 is formed overlying layer 68 to provide one plate of the MOS capacitor while well region 72 provides the other plate. By way of example, first contact 69 comprises a doped polycrystalline semiconductor material (e.g., doped polysilicon), or another conductive material, and may include a silicide layer or comprises several different materials formed in a layered structure. In one embodiment, first contact 69 comprises about 0.4 microns to about 0.8 microns of polysilicon doped with a high dose phosphorous implant (e.g., $1.0 \times 10^{15}$ atoms/cm$^2$ to about $1.0 \times 10^{16}$ atoms/cm$^2$). Next, a second passivation layer 71 is formed overlying major surface 84, and comprises for example, approximately 0.5 microns of a deposited oxide such as one formed using tetraethylorthosilicate (TEOS).

Openings 73 and 74 are then formed using conventional photoresist and etch techniques with opening 73 overlying a portion of well region 72, and opening 74 overlying the split portion of well region 72. A conductive layer is then formed overlying major surface 84 and within openings 73 and 74, and patterned to formed contacts 76 and 77. By way of example, contacts 76 and 77 comprise aluminum, an aluminum alloy, or another conductive material. In one embodiment, contacts 76 and 77 comprise about 2.0 microns of an aluminum/silicon alloy.

In accordance with the present invention, device 81 has a split well region 72 that is not continuous underneath layer 68. That is, capacitive layer 68 adjoins or contacts both region 37 and well region 72 to form a MOS-gated diode device. Stated another way, portions of well region 72 are separated by portions of region 37. Also in accordance with the present invention, split well region 72 forms both a plate of the capacitor element and an electrode or junction of the TVS element. In the present invention, the term split well region means a doped well region where a portion of the doped well region is separated or discontinuous so that a portion of substrate 37, a portion of doped region 272 (shown in FIGS. 7 and 9), or a portion of semiconductor layer 237 (shown in FIG. 8) is exposed within, surrounded by, partially bounded on one side, bounded on all sides, or encircled at major surface 84 by the well region. This is further illustrated in the plan views of split well region 72 in FIGS. 11-15 below.

Additionally in accordance with the present invention, the concentration of substrate 37 is selected so that the threshold voltage $V_T$ of the capacitor is positive, and the capacitance characteristic is substantially constant within a desired operating voltage range. For example, a high doping concentration (e.g., a surface concentration greater than about $1.0 \times 10^{18}$ atoms/cm$^3$) in substrate 37 results in a constant capacitance gate-to-source ($C_{GS}$) characteristic for gate-to-well voltages in the range of 3 volts and higher. Further in accordance with the present invention, electron or carrier rich well region 72 overlaps edges 181 and/or 182 of MOS gate 69, which ensures a low-resistance path to the channel formed under the MOS gate.

In another embodiment, well region 72 is formed using a high dose phosphorous ion implant to provide a peak concentration of about $3.0 \times 10^{19}$ atoms/cm$^3$ followed by a high dose arsenic ion implant to provide a peak concentration of about $5.0 \times 10^{19}$ atoms/cm$^3$. In an alternative embodiment, the order of the ion implants is reversed. The chain implant provides a net peak doping on the order of about $8.0 \times 10^{19}$ atoms/cm$^3$. In accordance with the present invention, this chain implant was found to reduce the series and contact resistance of well region 72 by up to 90%, which enhances for example, the RF characteristics of the structure.

In device 81, the MOS capacitor formed by contact 69, layer 68, and a portion of well region 72 provides the floating capacitive element (e.g., capacitors 17, 18, and/or 19 of FIG. 2) for devices 43, 44, and/or 46, and the pn junction formed between well region 72 and substrate 37 provides the TVS element (e.g., diodes 337, 338, and/or 339 of FIG. 2) for devices 43, 44, and/or 46. In accordance with the present invention, because device 81 is integrated, it has for example, lower resistance compared to the non-integrated devices of the prior art.

In device 81, the well/substrate capacitor formed between split well region 72 and substrate 37 forms a smaller area, which allows for a smaller lay-out in some applications. However, if a design requires a larger well/substrate diode, device 81 uniquely allows for an increase in well area without affecting the size of the MOS capacitor itself. An example of this feature will be described more fully in conjunction with FIGS. 11 and 12 below. Further, in device 81 the areas of the MOS capacitor (i.e., the area of contact 69 and layer 68 in opening 60) and well region 72 are independent, which in some applications provides more precise control over capacitance/voltage characteristics.

Figure 7:
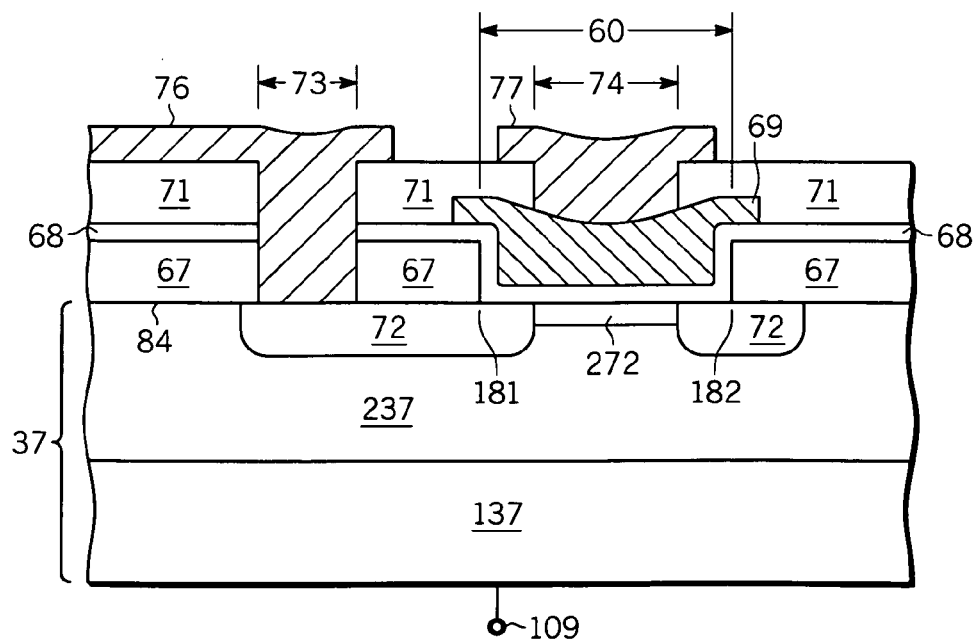
FIG. 7 illustrates an enlarged partial cross-sectional view of an embodiment of a device in accordance with another embodiment of the present invention.

FIG. 7 shows a highly enlarged partial cross-sectional view of an integrated linear (i.e., voltage independent) floating capacitor or MOS capacitor structure or capacitor/TVS structure or device 91 suitable for use as device 43, 44, and/or 46 in structure 15 in accordance with a second embodiment of the present invention. Device 91 is similar to device 81 except region 37 comprises a lightly doped p-type region 237 formed overlying a more heavily doped p-type substrate 137.

In certain applications such as where a MOSFET device is incorporated with an integrated MOS capacitor of the present invention, certain design challenges exist when highly doped region 37 is used by itself as in device 81. For example, p-type substrate 37 can result in threshold voltages that are positive and high in magnitude. Additionally, the heavy doping can impact the mobility of carriers in the channel region of the MOSFET device. Moreover, when well region 72 is formed directly in highly doped region 37 as in device 81, the pn junction formed between these regions may have higher than desired leakage current and higher than desired capacitance per unit area. In device 91, a lower capacitance and lower leakage pn junction is provided for use in those applications where these characteristics are desired.

In device 91, the junction between well region 72 to lightly doped region 237 behaves more like a one-sided junction where junction capacitance is dominated by the doping concentration and thickness of region 237. One constraint on the doping concentration and thickness of region 237 is that these variables are selected to support a desired breakdown voltage and ESD characteristic for the TVS device. The authors of the present invention found that device 91 in accordance with the present invention lowers specific capacitance by a factor of about 5-10×. This allows for a more precise tuning of the diode and floating MOS capacitor capacitances in a decoupled and independent manner, which adds degrees of freedom for design purposes.

By way of example, substrate 137 comprises a <100> p-type conductivity substrate having a dopant concentration on the order of about $1.0 \times 10^{19}$ atoms/cm$^3$. In one embodiment, substrate 137 comprises silicon. Alternatively, substrate 137 comprises other semiconductor materials such IV-IV or III-V materials. Layer 237 comprises for example, a p-type layer formed using for example, epitaxial growth techniques, and has a dopant concentration less than that of substrate 137. In one embodiment, layer 237 has a dopant concentration on the order of about $1.0 \times 10^{15}$ atoms/cm$^3$ to about $1.0 \times 10^{16}$ atoms/cm$^3$, and has a thickness on the order of about one micron to about ten microns. The doping concentration and thickness of layer 237 varies in accordance with known principles according to desired breakdown voltage and ESD requirements.

One additional feature of layer 237 is that it provides for a lightly doped n-type region 272 to be formed in major surface 84 below capacitive layer 68 and adjoining well region 72. Region 272 is optional and conveniently provides or is configured for controlling $V_T$ to a desired negative voltage, thereby ensuring a substantially constant MOS capacitance between zero and ten volts. In one embodiment, region 272 comprises a phosphorous or arsenic doped region with a peak dopant concentration on the order of about $1.0 \times 10^{16}$ atoms/cm$^3$.

Figure 8:
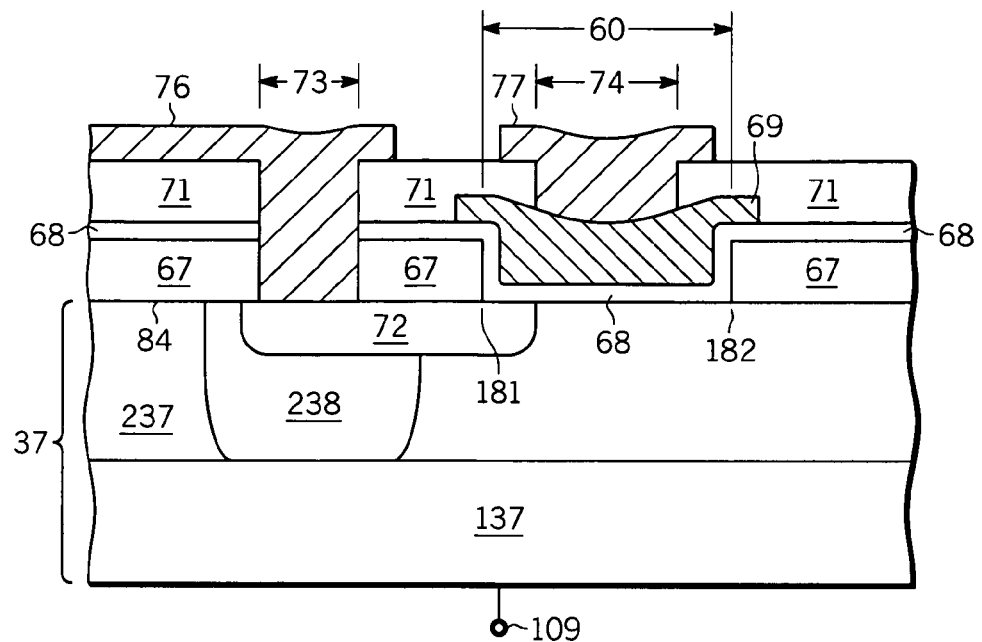
FIG. 8 illustrates an enlarged partial cross-sectional view of an embodiment of a device in accordance with a further embodiment of the present invention.

FIG. 8 shows a highly enlarged partial cross-sectional view of an integrated linear (i.e., voltage independent) floating capacitor or MOS capacitor structure or capacitor/TVS structure or device 101 suitable for use as device 43, 44, and/or 46 in structure 15 in accordance with a third embodiment of the present invention. Device 101 is similar to devices 81 and 91 except well region 72 comprises a one-sided split well, which overlaps only edge 181 of the MOS capacitor while edge 182 overlaps semiconductor layer 237. In this embodiment, electron-rich well region 72 overlaps only edge 181 of the MOS capacitor, which ensures a ready supply of charge for the formation of the channel in the MOS capacitor. This in turn enables high-frequency operation of the capacitor structure. Device 101 is further shown with optional doped region 238, which is either n-type or p-type, and is formed adjoining at least a portion of well region 72. In one embodiment, optional doped region 238 extends through layer 237 to semiconductor substrate 137. Optional doped region 238 has a higher dopant concentration than semiconductor layer 237, and is configured to control, change or reduce the breakdown voltage or clamping voltage of the junction between well region 72 and semiconductor layer 237.

Figure 9:
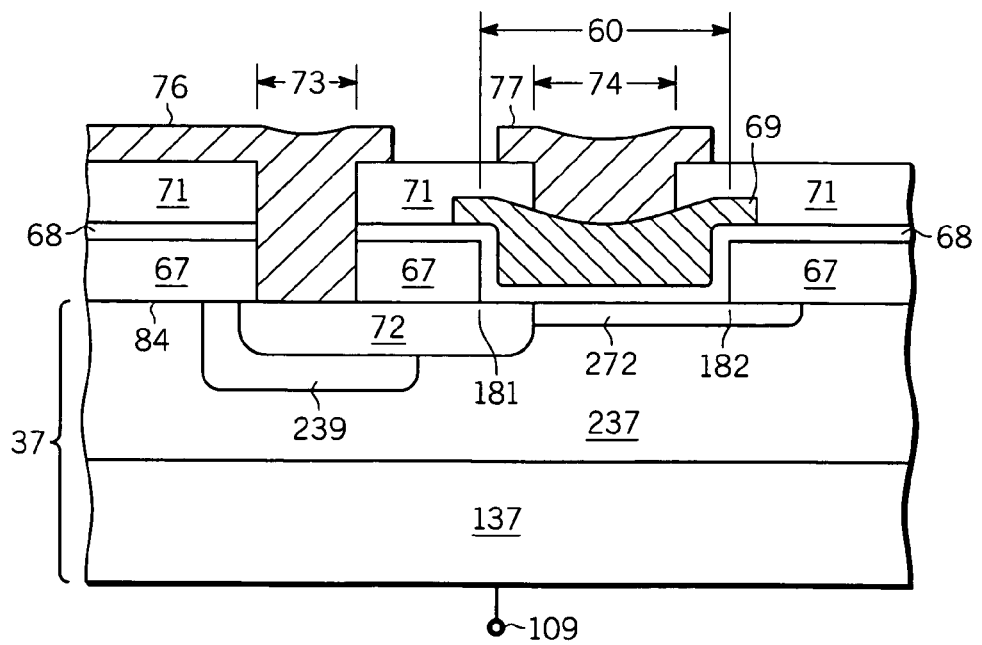
FIG. 9 illustrates an enlarged partial cross-sectional view of an embodiment of a device in accordance with a still further embodiment of the present invention.

FIG. 9 shows a highly enlarged partial cross-sectional view of an integrated linear (i.e., voltage independent) floating capacitor or MOS capacitor structure or capacitor/TVS structure or device 201 suitable for use as device 43, 44, and/or 46 in structure 15 in accordance with a fourth embodiment of the present invention. Device 201 is similar to device 101 and further includes n-type region 272 formed below the MOS capacitor at major surface 84 and adjoining well region 72. In this embodiment, region 272 extends to overlap edge 182 of the MOS capacitor. Device 201 further includes optional doped region 239 formed adjoining at least a portion of well region 72. In this embodiment, optional doped region 239 comprises a p-type region having a higher dopant concentration than semiconductor layer 237. Optional doped region 239 is configured to control, change, or reduce the breakdown voltage or clamping voltage of the junction between well region 72 and semiconductor layer 237.

Figure 10:
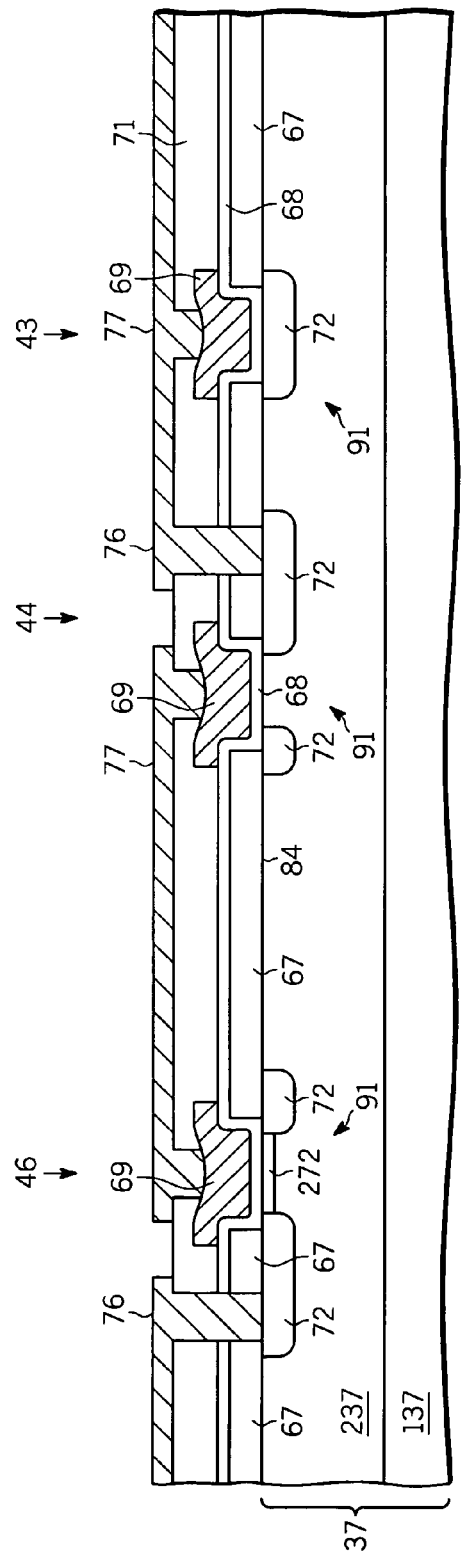
FIG. 10 illustrates an enlarged partial cross-sectional view of portion of the device of FIG. 3 taken along reference line 10-10.

FIG. 10 shows a highly enlarged partial cross-sectional view of device 10 of FIG. 3 taken along reference line 10-10 in accordance with the present invention. In this partial cross-section, devices 46, 44 and 43 are shown in the implementation of structure 15 of FIG. 3 as integrated devices 91 of FIG. 7 including optional doped region 272. In alternative embodiments, devices 46, 44 and/or 43 comprise device 81 of FIG. 6, device 101 of FIG. 8 and/or device 201 of FIG. 9.

Figure 11:
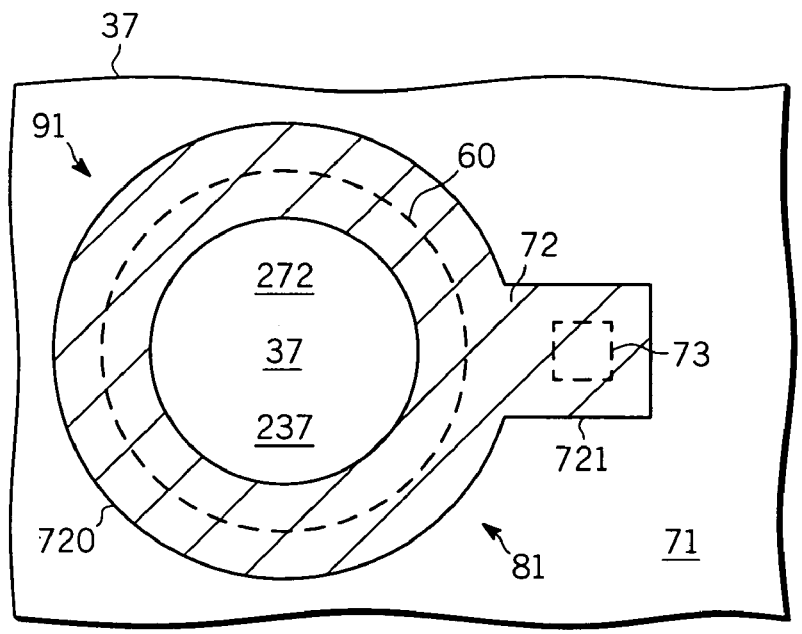
FIG. 11 illustrates an enlarged plan view of the devices of FIG. 6 and FIG. 7 in accordance with an embodiment of the present invention.

FIG. 11 shows a plan view of an embodiment of devices 81 and 91 in accordance with the present invention. In this embodiment, split well region 72 is lightly shaded to show that a portion of substrate 37 (or doped region 272. or semiconductor layer 237) is exposed through opening 70 in layer 67. Well region 72 includes a ring like portion 720 for defining the floating MOS capacitor element of devices 81 and 91, and a rectangular like portion 721, which provides a convenient structure for electrode 76 (shown in FIGS. 6 and 7) to make contact to well region 72 through opening 73 in layers 67, 68 & 71 (shown in FIGS. 6 and 7). An example of opening 60 in layer 67 (shown in FIGS. 6 and 7) is shown for further defining the floating MOS capacitor element of devices 81 and 91. It is understood that portions 720 and 721 of well region 72 may comprise other shapes including square, polygonal, circular, triangular, combinations thereof, or the like. Additionally, portion 721 may have rounded corners.

Figure 12:
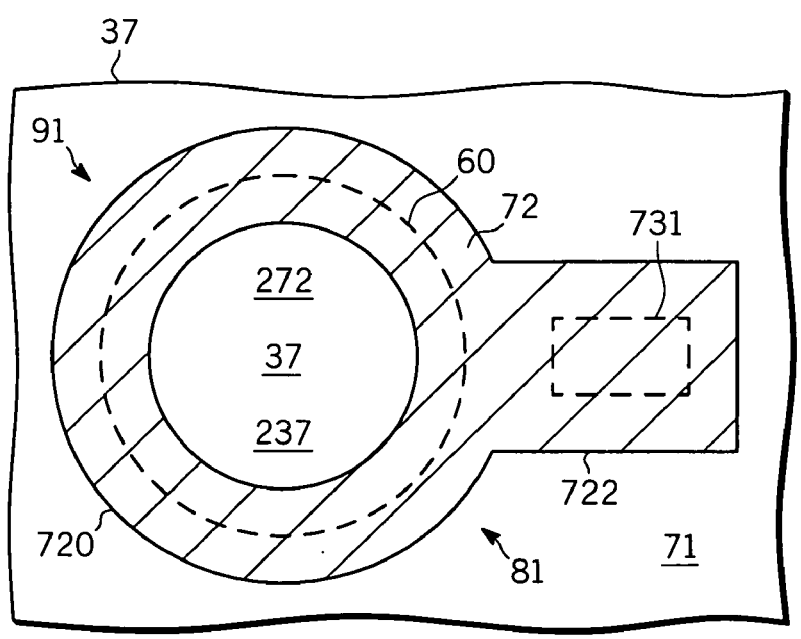
FIG. 12 illustrates an enlarged plan view of the devices of FIG. 6 and FIG. 7 in accordance with another embodiment of the present invention.

FIG. 12 shows a plan view of another embodiment of devices 81 and 91 in accordance with the present invention. This embodiment is similar to the embodiment of FIG. 11 except opening 731 is larger than opening 73 in FIG. 11, and portion 722 of split well region 72 is larger than portion 721 in FIG. 11. In the embodiment for device 91, region 272 or semiconductor layer 237 is exposed in opening 60 instead of substrate 37. FIG. 12 illustrates an advantage of the present invention because the area of the well substrate diode or TVS device can be increased (e.g., area of portion 722 is greater than the area of portion 721) without affecting the area of the MOS capacitor (portion 720). That is, in the present invention the area of the floating MOS capacitor is independent of the area of the well substrate diode.

Figure 13:
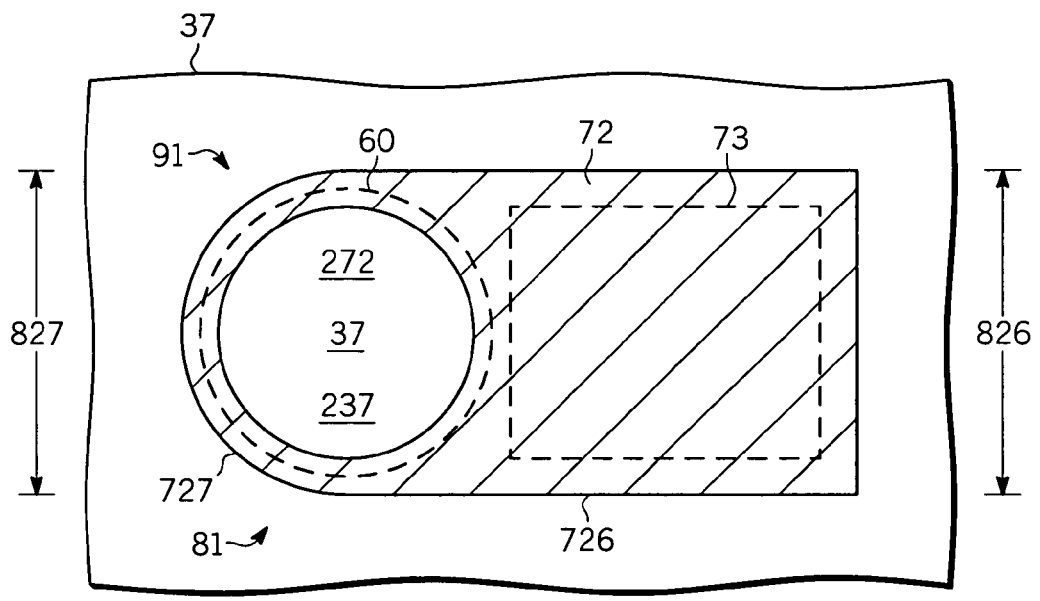
FIG. 13 illustrates an enlarged plan view of the devices of FIG. 6 and FIG. 7 in accordance with an additional embodiment of the present invention.

FIG. 13 shows a plan view of a further embodiment of devices 81 and 91 in accordance with the present invention. In this embodiment split well region 72 is shaped to include a rectangular portion 726 and a semi-circular ring portion 727. In the embodiment for device 91, region 272 or semiconductor layer 237 is exposed in opening 60 instead of substrate 37. Semi-circular ring portion 727 has a diameter 827 that is equal to height 826 of rectangular portion 726.

Figure 14:
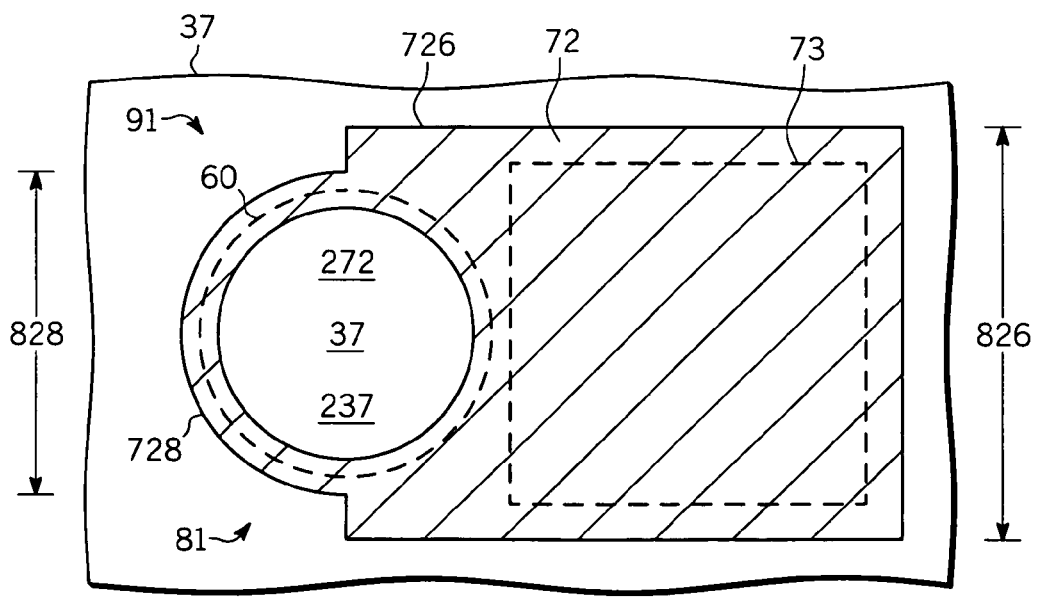
FIG. 14 illustrates an enlarged plan view of the devices of FIG. 6 and FIG. 7 in accordance with a further embodiment of the present invention.

FIG. 14 shows a plan view of a still further embodiment of devices 81 and 91 in accordance with the present invention. In this embodiment, split well region 72 is shaped to include a rectangular portion 726 and a semi-circular ring portion 728. In the embodiment for device 91, region 272 or semiconductor layer 237 is exposed in opening 60 instead of substrate 37. Semi-circular ring portion 728 has a diameter 828 that is less than height 826 of rectangular portion 726. That is, semi-circular ring portion 728 is offset in or set in with respect to rectangular portion 726.

Figure 15:
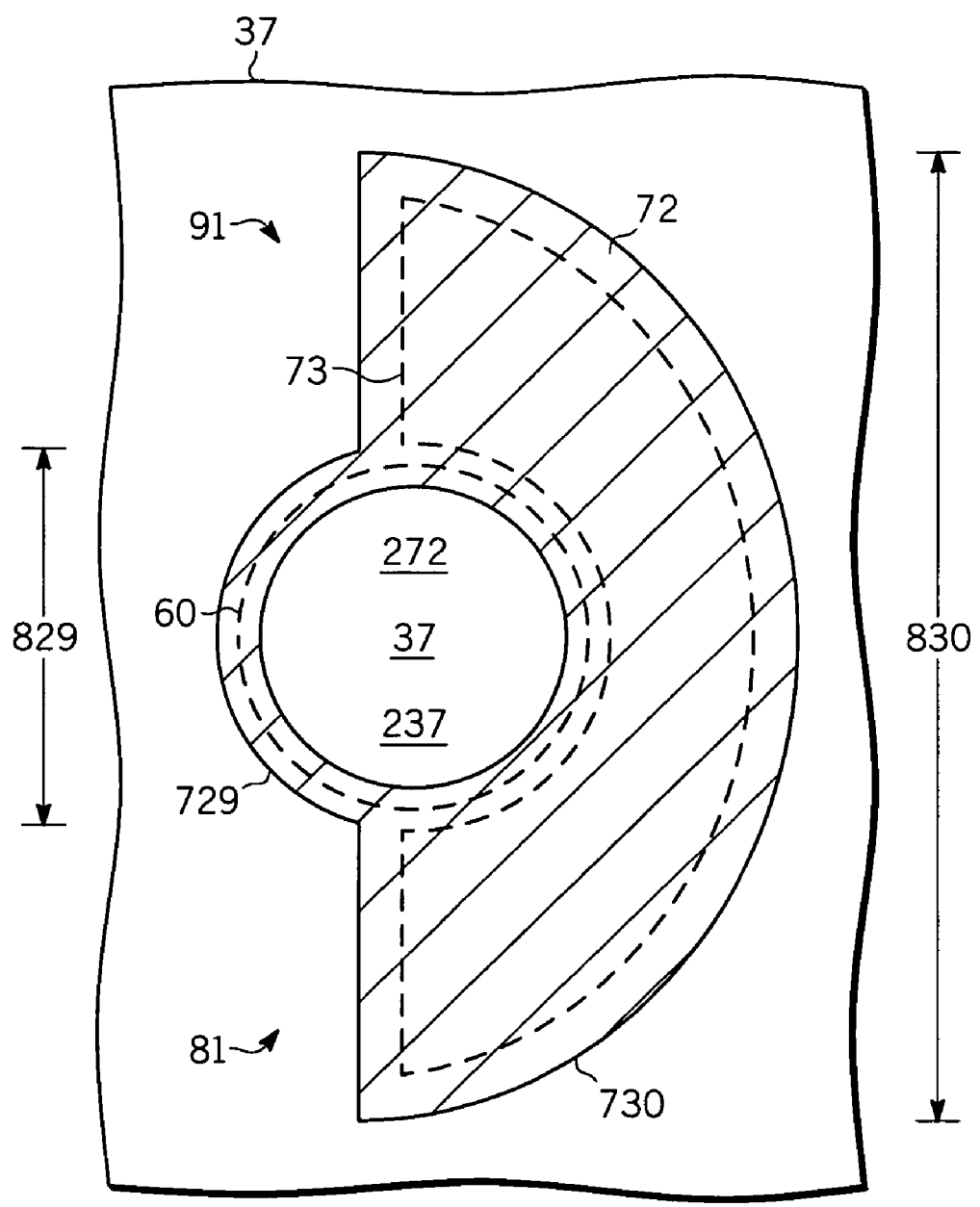
FIG. 15 illustrates an enlarged plan view of the devices of FIG. 6 and FIG. 7 in accordance with a still further embodiment of the present invention.

FIG. 15 shows a plan view of an additional embodiment of devices 81 and 91 in accordance with the present invention. In this embodiment, split well region 72 is shaped to include a semi-circular ring portion 729 and semi-circular portion 731. In the embodiment for device 91, region 272 or semiconductor layer 237 is exposed in opening 60 instead of substrate 37. Semi-circular ring portion 729 has a diameter 829 that is smaller than diameter 830 of semi-circular portion 730. That is, semi-circular ring portion 729 is offset in or set-in with respect to semi-circular portion 730.

In view of all the above, it is evident that an integrated floating capacitor/TVS device structure and a method of manufacture has been provided. The structure saves on space, is conveniently integrated with other device components when forming resonant structures such as elliptic filters, and provides performance characteristics equal or better than prior art filter designs.

Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

We claim:

1. A filter structure comprising:
   a semiconductor region of a first conductivity type and having a first major surface, wherein the semiconductor region comprises a semiconductor substrate having a first dopant concentration, and a semiconductor layer of the first conductivity type formed overlying the semiconductor substrate and having a second dopant concentration less than the first dopant concentration;
   a first floating capacitor device formed adjacent the first major surface; and
   a first transient voltage suppression device formed adjacent the first major surface, wherein the first floating capacitor device and the first transient voltage suppression device share a first doped region of a second conductivity type formed in the semiconductor region, and wherein the first doped region terminates at the first major surface so that the first floating capacitor device overlies a portion of the semiconductor region and a portion of the first doped region.

2. The filter structure of claim 1, wherein the first floating capacitor device comprises:
   a capacitive layer formed overlying the first major surface above a portion of the first doped region;
   a first conductive layer formed overlying the capacitive layer, wherein the first conductive layer forms a first plate of the first floating capacitor device; and
   a second conductive layer formed coupled to the first doped region at the first major surface, wherein the first doped region forms the second plate of the first floating capacitor device, and wherein the first doped region further forms an electrode of the first transient voltage suppression device.

3. The filter structure of claim 1, further comprising a second doped region of the second conductivity type formed in the semiconductor layer adjacent the first doped region and configured to control threshold voltage of the floating capacitor.

4. The filter structure of claim 1, further comprising a second doped region formed adjacent the first doped region and configured to control clamping voltage of the first transient voltage suppression device.

5. The filter structure of claim 4, wherein the second doped region comprises the first conductivity type, and has a higher dopant concentration than the semiconductor layer.

6. The filter structure of claim 4, wherein the second doped region comprises the first conductivity type and extends through the semiconductor layer to the semiconductor substrate.

7. The filter structure of claim 4, wherein the second doped region comprises the second conductivity type and extends through the semiconductor layer to the semiconductor substrate.

8. The filter structure of claim 1, wherein the first doped region comprises a split doped region separated at the first surface so that a portion of the semiconductor region is surrounded by the split well region.

9. The filter structure of claim 1 further comprising a first inductor overlying at least a portion of the substrate.

10. The filter structure of claim 1 further comprising a first multilayer inductor overlying at least a portion of the semiconductor substrate, the first multilayer inductor having a first terminal and a second terminal, the first multilayer inductor also having a first conductor overlying the portion of the semiconductor substrate, a second conductor overlying at least a portion of the first conductor, a first dielectric disposed between the first conductor and the second conductor.

11. The filter structure of claim 10 wherein the first conductor and the second conductor are metal conductors.

12. The filter structure of claim 10 further including a second multilayer inductor coupled to the first multilayer inductor.

13. The filter structure of claim 1, wherein the first doped region comprises:
   a first portion for forming a MOS gated diode; and
   a second portion for forming a contact region to the MOS gated diode.

14. The filter of claim 13, wherein the first portion comprises a ring shape, and wherein the second portion comprises a rectangular shape.

15. The filter of claim 13, wherein the first portion comprises a semi-circular ring, and the second portion comprises one of a rectangular shape or a semi-circular shape.

16. A semiconductor filter structure comprising:
   a semiconductor substrate of a first conductivity type and having a first major surface and a first dopant concentration;
   a semiconductor layer of the first conductivity type formed overlying the first major surface, wherein the semiconductor layer has a second dopant concentration less than the first dopant concentration; and
   a first doped region of a second conductivity type opposite the first conductivity type formed in the semiconductor layer, wherein the first doped region is configured to form a TVS device with the semiconductor layer, and wherein the first doped region is further configured to form one plate of a floating MOS capacitor.

17. The structure of claim 16, wherein the first doped region comprises a split well region wherein the floating MOS capacitor adjoins a portion of the semiconductor layer and further adjoins a portion of the first doped region.

18. The structure of claim 17, further comprising a second doped region of the second conductivity type formed in the semiconductor layer adjacent the first doped region, wherein the second doped region is configured to control threshold voltage of the floating MOS capacitor.

19. The filter structure of claim 16 further comprising an inductor overlying at least a portion of the semiconductor substrate.

20. The filter structure of claim 16 further comprising a first multilayer inductor overlying at least a portion of the semiconductor substrate; the first multilayer inductor having a first terminal and a second terminal, the first multilayer inductor also having a first conductor overlying the portion of the semiconductor substrate, a second conductor overlying at least a portion of the first conductor, a first dielectric disposed between the first conductor and the second conductor, wherein one of the first or second terminals is coupled to the floating MOS capacitor.

21. The filter structure of claim 20 wherein the first conductor and the second conductor are metal conductors.

22. The filter structure of claim 20 further including a second multilayer inductor coupled to the first multilayer inductor.

23. A method for forming a semiconductor filter structure comprising the steps of:
   providing a semiconductor substrate of a first conductivity type and having a first major surface and a semiconductor layer of the first conductivity type formed overlying the first major surface; and
   forming a first doped region in the semiconductor substrate having a second conductivity type, wherein the first doped region comprises a split well region, and wherein the first doped region is configured to form a TVS device with the semiconductor, and wherein the first doped region is further configured to form one plate of a floating MOS capacitor.

24. The method of claim 23, further comprising the step of forming a second doped region of the second conductivity type in the semiconductor layer adjacent the first doped region, wherein the second doped region is configured to control threshold voltage of the floating MOS capacitor.

25. The method of claim 23, wherein the step of forming the first doped region includes forming the first doped region wherein the first doped region comprises a ring shaped portion and a rectangular shaped portion.

26. The method of claim 23 further comprising the step of forming a first multilayer inductor overlying at least a portion of the semiconductor substrate, the first multilayer inductor having a first terminal, and a second terminal, the first multilayer inductor also having a first conductor overlying the portion of the semiconductor substrate, a second conductor overlying at least a portion of the first conductor, a first dielectric disposed between the first conductor and the second conductor.

27. The method of claim 23 wherein the step of forming the first doped region includes the steps of
   ion implanting a first dopant species of the second conductivity type into the semiconductor layer; and
   ion implanting a second dopant species of the second conductivity type into the semiconductor layer.

* * * * *

UNITED STATES PATENT AND TRADEMARK OFFICE
CERTIFICATE OF CORRECTION

PATENT NO. : 7,466,212 B2
APPLICATION NO. : 11/454387
DATED : December 16, 2008
INVENTOR(S) : Sudhama Shastri et al.

Page 1 of 1

It is certified that error appears in the above-identified patent and that said Letters Patent is hereby corrected as shown below:

In the Claims

In Claim 8: column 10, line 50, replace the word "doped" with --well--.

In Claim 14: column 11, line 6, insert the word --structure-- between "filter" and "of".

In Claim 15: column 11, line 9, insert the word --structure-- between "filter" and "of".

In Claim 17: column 11, line 26, insert the word --filter-- between "The" and "structure".

In Claim 18: column 11, line 30, insert the word --filter-- between "The" and "structure".

In Claim 23: column 12, line 19, insert the word --layer-- between "semiconductor" and ",".

Signed and Sealed this
Fifteenth Day of October, 2013

Teresa Stanek Rea
*Deputy Director of the United States Patent and Trademark Office*